United States Patent [19]

Gilissen

[11] 3,934,959

[45] Jan. 27, 1976

[54] ELECTRICAL CONNECTOR

[75] Inventor: Hermanus Petrus Johannes Gilissen, Vlijmen, Netherlands

[73] Assignee: AMP Incorporated, Harrisburg, Pa.

[22] Filed: July 22, 1974

[21] Appl. No.: 490,621

[30] Foreign Application Priority Data

Aug. 8, 1973 Netherlands .................... 7310941

[52] U.S. Cl. .......................... 339/17 M; 339/59 M

[51] Int. Cl.² .................... H05K 1/00; H01R 11/02

[58] Field of Search . 339/17 R, 17 E, 17 L, 17 LM, 339/17 M, 48, 49, 59–61, 204, 205, 208

[56] References Cited

UNITED STATES PATENTS

| | | | |
|---|---|---|---|
| 2,777,976 | 1/1957 | Brafman | 339/218 C X |
| 3,365,696 | 1/1968 | Wagner | 339/17 R X |
| 3,609,463 | 9/1971 | Laboue | 339/17 LM X |
| 3,614,707 | 10/1971 | Kaufmann et al. | 339/17 L X |
| 3,680,209 | 8/1972 | Hacke | 339/17 R X |
| 3,795,037 | 3/1974 | Luttmer | 339/61 M X |

OTHER PUBLICATIONS

V. Bresg; Spring Contactor; IBM Technical Disclosure Bulletin, Vol. 10, No. 4; Sept. 1967; p. 363.

Becon Connector; New Development in Connectors; Electronic Design 3-15-62; p. 65.

Becon Connector; New Design/Improved Reliability; Electronic Design 11-8-61; p. 39.

*Primary Examiner*—Joseph H. McGlynn
*Assistant Examiner*—Craig R. Feinberg
*Attorney, Agent, or Firm*—William J. Keating; Jay L. Seitchik; Frederick W. Raring

[57] ABSTRACT

A matrix connector comprises an elastomer body presenting a pair of opposite contact surfaces at each of which is disposed a multiplicity of spaced contacts, the contacts of the opposite faces being interconnected by conductors extending through the body, the contacts are defined by folds of the conductors extending through the elastomeric mass, convex portions of the folds being exposed at the opposite faces. Suitably such a connector is made forming the conductive strips on opposite faces of a flexible printed circuit, and interconnected at overlapping portions through holes in the flexible lamina. The lamina is folded in concertina form with adjacent limbs spaced by strips of partially cured elastomer. The assembly is then compressed and cured.

2 Claims, 12 Drawing Figures

ELECTRICAL CONNECTOR

This invention concerns an electrical connector and its method of manufacture and is particularly concerned with connectors of the kind referred to as matrix connectors.

A matrix connector comprises a plurality of conductive paths extending in electrically spaced relation through an insulating body between opposite or spaced surface parts of the body at which the conductive paths present discrete contacts. The matrix connector serves in use to interconnect complementary contact arrays disposed at opposite sides of the matrix connector which is sandwiched between the contact arrays. This type of connector is of significant technical and industrial importance in view of the trend to miniaturization of assemblies, the extensive use of integrated circuits and the construction of complex assemblies such as calculating machines and computers from small circuit modules requiring the interconnection between modules of large numbers of small, closely spaced electrical contacts.

In one form of matrix connector disclosed in the U.S. publication Automotive Industries of Dec. 15, 1971, there was proposed the use of a contact material comprising an electrically conductive elastomer. In the proposed connector, compressed cells of the elastomeric contact material were positioned in spaced relation within an elastomeric insulating frame to define a composite diaphragm. The proposed connector was intended for use with relatively large size contacts such as are customary in automobile applications.

In another form of connector proposed in German Offenlegungsschrift No. 2,119,567 published Nov. 25, 1971, a body of elastomeric insulating material contained a multiplicity of discrete conductive springs extending through a body in insulating spaced relation and in similar nonrectilinear paths between spaced surface parts of the body. Ends of the springs define a multiplicity of closely spaced contact points. Such a connector was proposed to be manufactured by etching or stamping the springs from sheet metal to define lamina arrays of springs held in spaced relationship by a frame formed from the sheet metal and integrally joining the spring ends. A series of such frames were stacked side-by-side in closely spaced relation and the stack potted in elastomeric insulating material before severing the frame portions to define the contact ends.

An improved method of manufacture of such a connector has been proposed by AMP Incorporated in U.S. Pat. application Ser. No. 320,030 in which the springs are defined by parts of coil turns. A conductive wire is wound in a coil of closely spaced turns and then potted in elastomeric insulating material before cutting a segment of the coil through the turns to present a body portion with cut surfaces at which are exposed a multiplicity of respective ends of segments of the coil turns.

In the two last mentioned proposals particular difficulties arise in the cutting of the spring ends which may require a grinding operation at the surface of the elastomer material to obviate burrs and a plating operation to define adequate contact surfaces. Also, some considerable care is required during manufacture of the conductive springs to ensure consistent spring characteristics throughout the matrix.

The present invention provides an improved connector and an improved method of manufacture.

A matrix connector according to the present invention comprises an elastomer body presenting a pair of opposite contact surfaces at each of which is disposed a multiplicity of spaced contacts, the contacts of the opposite faces being interconnected by connectors extending through the body, characterized by the contacts being defined by folds of the conductors extending through the elastomeric mass, convex portions of the folds being exposed at the opposite faces.

A method of manufacturing a matrix connector comprising an elastomer body presenting a pair of opposite contact surfaces at each of which is disposed a multiplicity of spaced contacts, the contacts of the opposite faces being interconnected by conductors extending through the body, according to the present invention comprises forming a lamina flexible printed circuit with sets of conductive strips on opposite sides with portions of sets at opposite sides overlapping and forming apertures in the insulating lamina of the printed circuit, interconnecting the overlapping portions through holes in the insulating lamina of the printed circuit, folding the printed circuit in concertina fashion with sets of conductive strips extending externally around the folds of the concertina, spacing adjacent limbs of the concertina form with strip-like partially cured elastomer material and compressing the concertina longitudinally to effect extrusion of the elastomer through the apertures in the printed circuit lamina and into the troughs of the concertina form, and curing the elastomer to a homogeneous mass.

The invention will now be described, by way of example, with reference to the accompanying partly diagrammatic drawings, in which.

Figure 1:
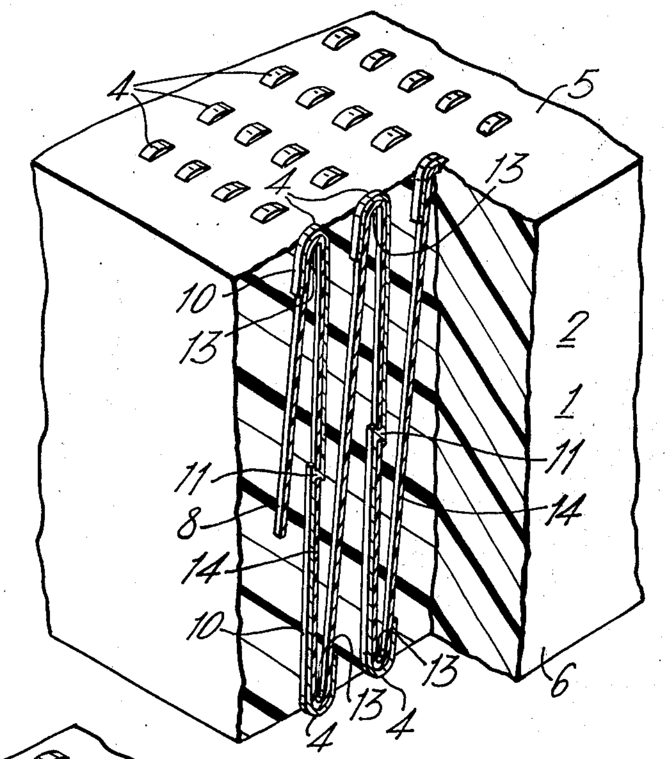
FIG. 1 is a fragmentary partly sectioned perspective view of a connector according to the invention.
Figure 2:
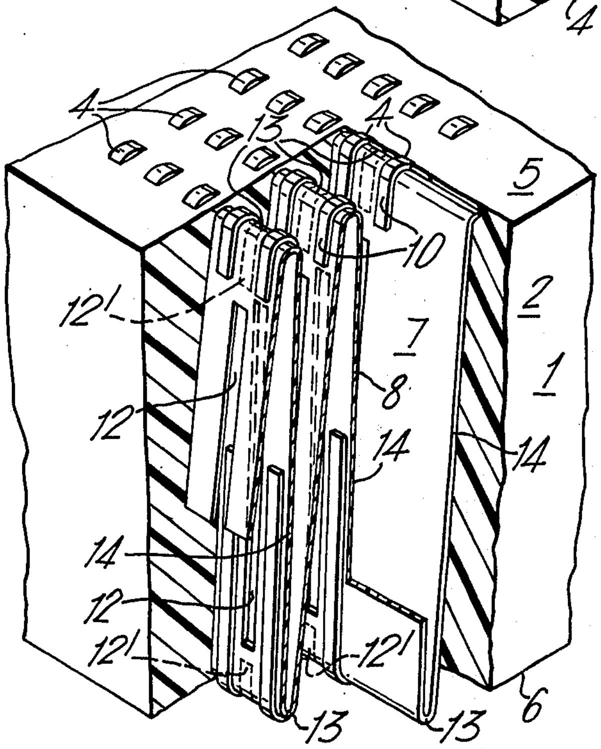
FIG. 2 is a view similar to that of FIG. 1 but with the elastomeric matrix removed over a section to expose a flexible printed circuit within the connector.

The matrix of FIGS. 1 and 2 comprises a generally rectangular slab-like block 1 of which only a corner part is shown. The block 1 comprises a matrix of elastomeric insulating material 2 and multiplicities of contacts 4 are exposed in corresponding, evenly spaced arrays at the upper and lower faces 5, 6 of the block. Each contact 4 at the upper face 5 is connected through the block 1 to a respective contact 4 at the lower face 6 and suitably the respective contacts 4 are opposite in a sense normal to the faces 5, 6 as is more clearly apparent in FIGS. 9 and 10.

Figure 3:
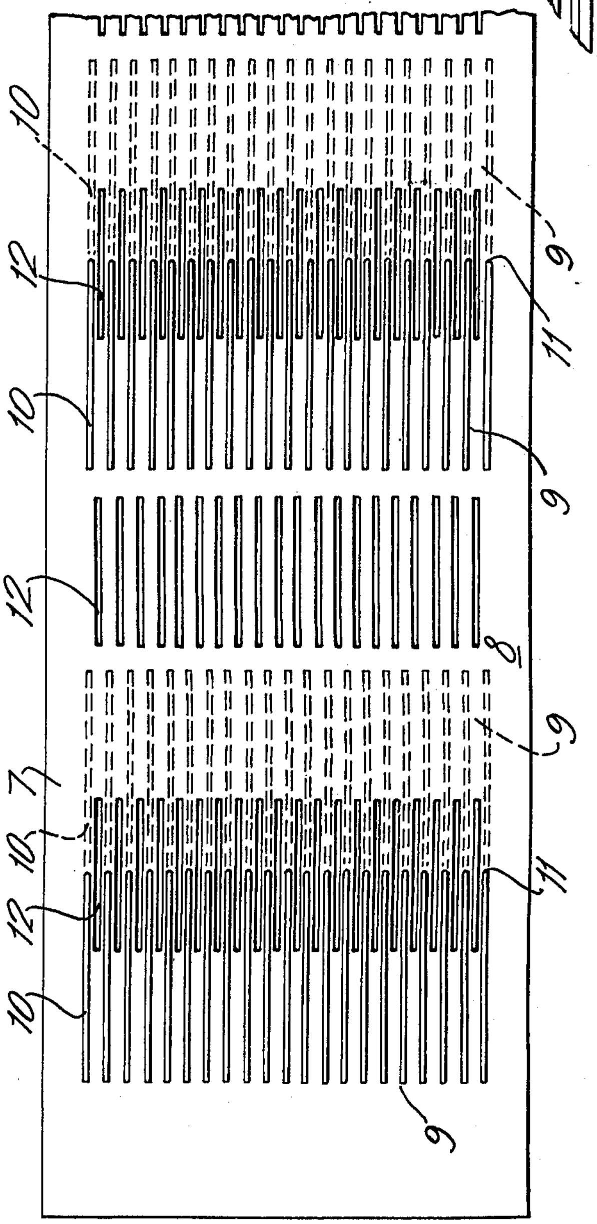
FIG. 3 is a fragmentary plan view of the flexible printed circuit of the connector of FIGS. 1 and 2 before forming and assembly into the connector
Figure 3A:
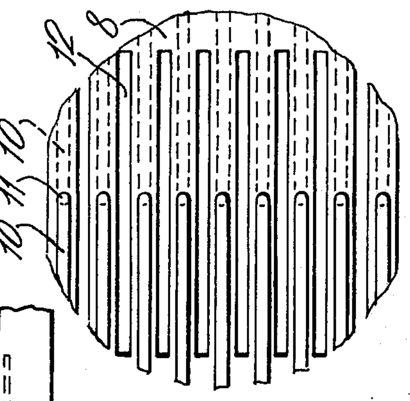
FIG. 3A is a detail of the circuit pattern of FIG. 3 shown to an enlarged scale.
Figure 4:
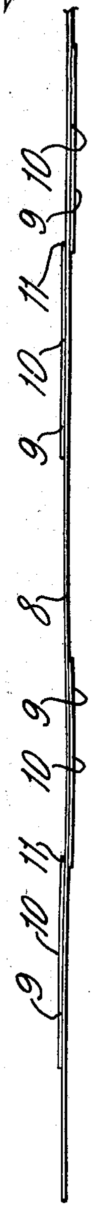
FIG. 4 is a fragmentary side edge view of the circuit of FIG. 3 and FIGS. 5 and 6 are similar side views after successive concertina forming stages.
Figure 10:
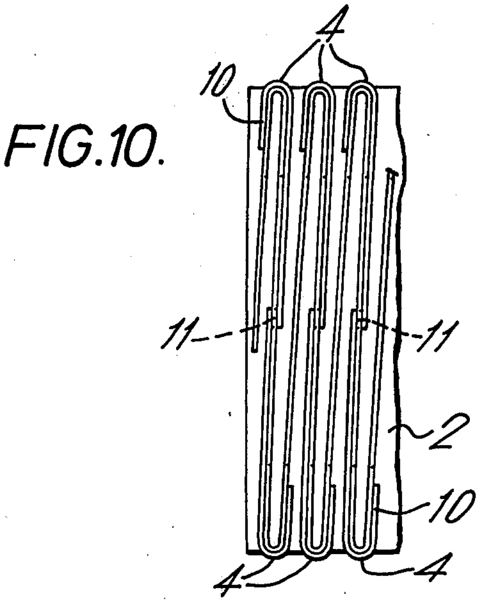
FIG. 10 is a fragmentary side elevation of the FIG. 9 assembly after a further manufacturing stage and to an enlarged scale.

The contacts 4 and their interconnections comprise conductive tracks of a flexible printed circuit 7 of concertina form as seen in FIGS. 1, 2 and 10, and shown in flat unformed condition in FIG. 3. The flexible printed circuit 7 comprises a flexible insulating lamina 8 of, for example, MYLAR, formed on opposite sides with sets 9 of of parallel conductive tracks 10. The tracks 10 of the sets 9 are aligned longitudinally and comprise tracks of uniform length. On each side of the lamina, sets are spaced at equal intervals of length greater than the length of the tracks and the sets of tracks on the opposite sides overlap by a short distance at apertures in the lamina through which conductive paths 11 extend to interconnect the overlapping conductive tracks 10. The conductive paths 11 are suitably formed as so called plated through holes by electro deposition techniques, and the tracks 10 are suitably of copper, plated with a contact metal such as gold.

The insulating lamina 8 is formed with sets of slots 12 extending between the conductors of the sets at and on opposite sides of the plated through holes 11 but terminating well short of the ends of the tracks remote from the plated through holes. Further sets of slots 12 are disposed in the intervals between sets of conductors.

The flexible printed circuit 7 of concertina form extends between the opposite faces 5, 6 of the elastomer matrix body and presents alternate peaks or folds 13 at the faces 5 and 6. The sets of tracks 10 are disposed on the sides of the insulating lamina 8 externally of the folds 13 which extend transversely of the tracks 10. At the folds 13 the conductive tracks are exposed at the surfaces 5, 6 to define the contacts 4. The sets of slots 12 are disposed in the limbs 14 of the concertina form between and inwards of the surfaces 5, 6 the elastomer matrix 2 extending through the slots 12 to present an integral mass of elastomer 2 encasing the flexible printed circuit. The plated through hole portions 11 are disposed generally midway between the surfaces 5, 6 and adjacent limbs 14 of the concertina form are held in spaced relationship by intervening elastomer material which extends into the troughs internally of the folds 13 to fill all spaces within block 1.

The folds 13 of the insulating lamina 8 may extend to the surface of the elastomer matrix, or the lamina 8 may be formed with additional slots 12', shown in borken lines in FIG. 2, bridging the folds and disposed between adjacent conductive tracks 10.

In use, when the matrix connector of FIGS. 1 and 2 is sandwiched between a pair of contact arrays which are urged together to compress the block 1, the elastomeric matrix is deformed to accommodate the load and develop contact pressure. The support of the contacts 4 by elastomeric material in the troughs within the folds resists any tendency for the elastomer to relax above the contacts 4 is resisted by relaxation of the elastomer in the troughs within the folds 13.

The connector described in FIGS. 1 and 2 is suitably manufactured from flexible printed circuitry formed as flat sheet material on opposite sides of which the conductive tracks can be formed in any desired pattern by known techniques which, for example, are currently being used to manufacture micro circuits for mounting integrated circuit chips.

The flexible printed circuit of FIG. 3 may, for example, comprise an insulating lamina of thickness 0.002 inches (0.051mm) and the conductive tracks of copper of width 0.003 inches and thickness of 0.0015 inches (0.076 and 0.038mm respectively) suitably gold plated. The pitch of the tracks may be, for example, 0.006 inches (0.15mm), defining the pitch transversely of the tracks 10 in the matrix array of contacts 4 and a pitch lengthwise of the tracks somewhat greater than twice the sum of the film and track thickness:

i.e. greater than 2(0.002 + 0.015) = 0.0070 inches
= 0.178mm.

Desirably the minimum thickness of elastomer between adjacent conductive track portions will be at least as great as the lamina thickness i.e. 0.002 inches 0.05mm so a pitch of 0.178 + 0.05 = 0.225mm may be employed. Thus, starting with a flexible printed circuit having the dimensional parameters specified it is possible to manufacture a matrix connector having contacts 4 arranged in a rectangular grid pattern of pitch 0.152mm widthwise of the connector and 0.225mm lengthwise. It is possible to form sharp folds in the flexible printed circuit without adverse deformation of the track portions forming the contacts 4.

Figure 5:
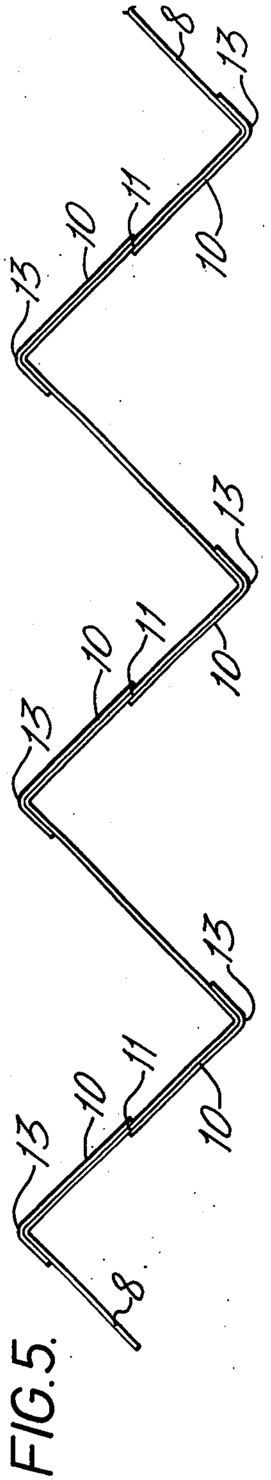
Figure 6:
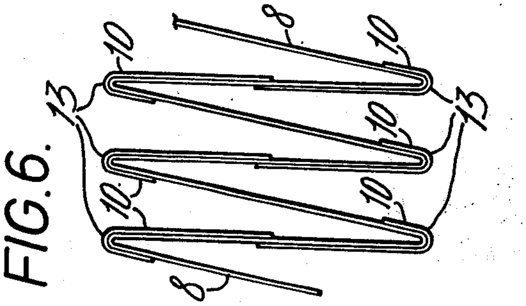
Figure 7:
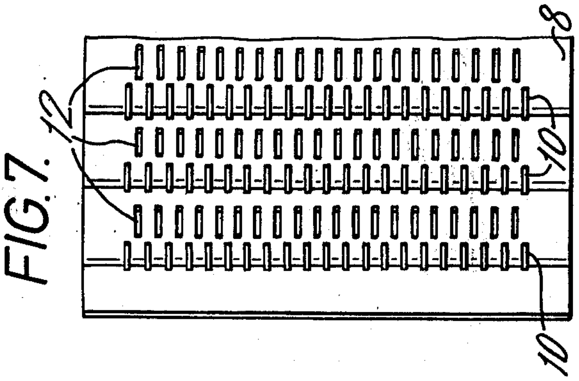
FIG. 7 is an underside view of the concertina form of FIG. 6.

The flat flexible printed circuit of FIG. 3 is suitably folded into a concertina by a heated die comprising interdigitating fingers arranged to engage the circuit 7 at opposite sides at the fold lines and progressively move together to reduce the pitch of the fingers as they interdigitate. The fold lines 13 extend transversely of the conductive tracks 10 at locations distal from the plated through holes 11 and the die-fingers engage the insulating lamina 8 on a side opposite the tracks 10. The folding operation is suitably effected in a series of stages as shown in FIGS. 5 and 6 and, as seen in FIG. 6, the limbs 14 of the concertina are asymmetrically arranged. The alternate limbs 14 carrying the conductive strips 10 and through plated holes 11 are substantially vertical and shorter than the intervening larger limbs 14. If desired the limbs of the concertina may be formed into a non-rectilinear shape in order to reduce the stiffness of the resultant connector.

Figure 8:
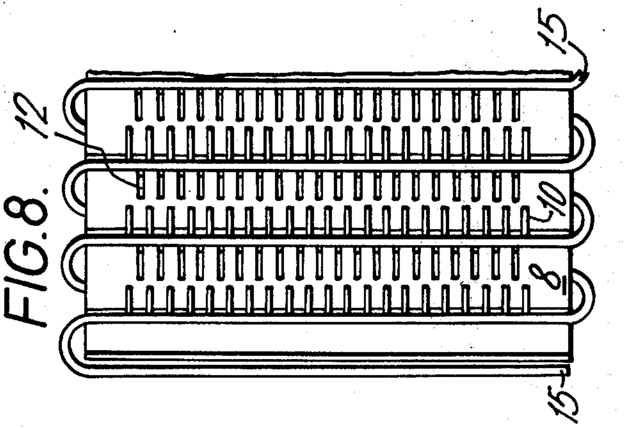
FIG. 8 is a view similar to that of FIG. 7 but after threading of an elastomer strip through the concertina form.
Figure 9:
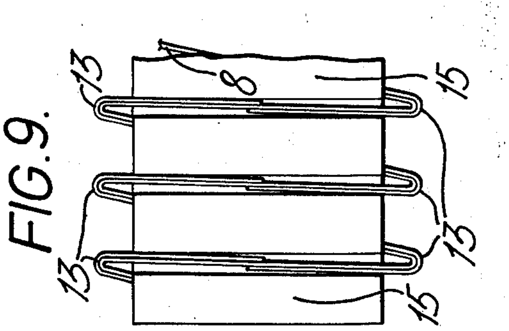
FIG. 9 is a fragmentary side elevation of the FIG. 8 assembly.

With the concertina form as shown in FIG. 6 a strip 15 of uncured or partly cured elastomer is threaded through the intra-limb spaces in succession as shown in FIGS. 8 and 9 or individual strips may be disposed in the spaces. The strip 15 of elastomer extends through a major part of the fold amplitude of the concertina form and serves to space apart the adjacent limbs 14. The assembly of FIGS. 8 and 9 is then suitably compressed lengthwise in a confining die presenting flat surfaces engaging the contact forming parts 4 and adapted slightly to tilt the limbs 14 of the concertina to align respective pairs of contacts 4 at the flat surfaces in a direction normally of these surfaces. Such alignment may be facilitated if the limbs of the concertina are given a non-rectilinear form, e.g. arcuate. Compression of the concertina form longitudinally within a surrounding confining die effects extrusion of the elastomer through the slots 12 and into the troughs to form a homogeneous matrix of elastomer encasing the concertina form flexible printed circuit 7. If, as mentioned above, additional holes or slots 12' are formed bridging the folds 13, the elastomer is additionally extruded into the fold spaces between adjacent conductive tracks to give greater separation or independent flexibility of the contact points defined at the folds. If non-rectilinear concertina limbs are desired the compressing dies may be of complementary shape. Encapsulation of the contacts 4 is avoided due to their engagement with dies surfaces under the pressure of the elastomer within the troughs. The elastomer is then cured in the die at an appropriate elevated temperature, after which the connector may be removed for use.

The connector so formed may be of any length, according to the length of flexible circuitry, and after forming may be cut parallel to the folds into sections.

Although the connector has been described with contacts 4 of each pair of opposite contacts being interconnected, several pairs may be interconnected in series. Also the conductive tracks 10 of the circuit member 7 may be other than rectilinear in order to obtain different patterns of interconnection.

Figure 11:
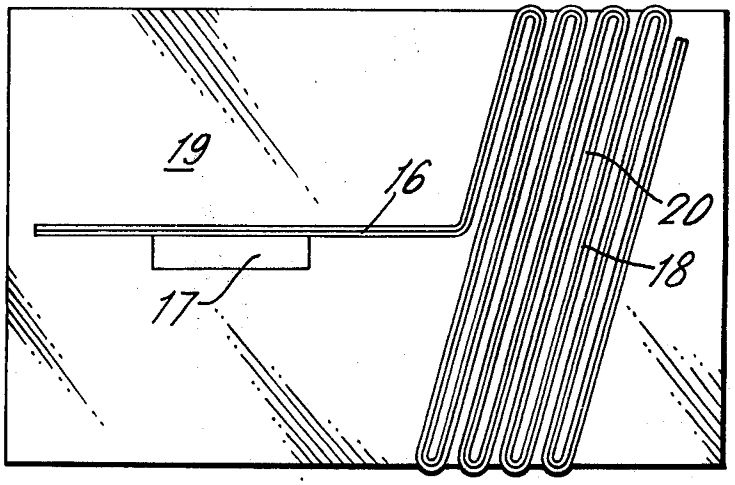
FIG. 11 is a schematic elevation of a connector incorporating functional circuitry.

In one application of the invention as shown in FIG. 11, a flexible printed circuit member 16 is provided with an integrated circuit member 17 at one end connected to appropriate conductive tracks formed on the printed circuit and leading to a concertina form portion 18 of the circuit. The whole of the circuit is potted in an elastomer matrix 19 containing the integrated circuit and at the concertina portion defining a matrix connector 20 for releasably interconnecting the integrated circuit into further circuitry.

There is a wide choice of elastomeric insulating material which may be employed in the above described method in its partially cured state e.g. Butyl rubber, B-stage Polyurethane, or other partly cured rubbers embodying a cross-linking agent.

What is claimed is:

1. A matrix connector comprising an elastomer body presenting a pair of opposite contact surfaces at each of which is disposed a multiplicity of spaced contacts, the contacts of the opposite faces being interconnected by conductors extending through the body, in which the contacts are defined by folds of the conductors extending through the elastomeric mass, convex portions of the folds being exposed at the opposite faces, said conductors comprise flat metal strips formed as circuits on a lamina flexible printed circuit folded in concertina fashion and encased within the elastomer body, the metal strips extending externally around respective concertina folds to define the contacts exposed at the contact surfaces of the elastomer body, the strips associated with alternate folds of the concertina form being disposed on one side of the printed circuit and the strips associated with the intervening folds being formed on the opposite side of the printed circuit, strips on one side of the circuit being connected with respective strips on the other side through holes in a flexible insulating lamina of the circuit at locations within the elastomer body inwards of the contact surfaces, and the elastomer extending through apertures in the insulating lamina.

2. A connector as claimed in claim 1, in which an integrated circuit component is mounted on the flexible printed circuit and connected to flat metal strips forming contacts of the connector, the integrated circuit component being encased within the elastomeric mass.

* * * * *